United States Patent
Kim et al.

(10) Patent No.: US 6,806,139 B2
(45) Date of Patent: Oct. 19, 2004

(54) METHOD OF FABRICATING A MIM CAPACITOR USING ETCHBACK

(75) Inventors: Wan-don Kim, Yongin (KR); Jae-hyun Joo, Seoul (KR); Cha-young Yoo, Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/266,606

(22) Filed: Oct. 9, 2002

(65) Prior Publication Data

US 2003/0104638 A1 Jun. 5, 2003

(30) Foreign Application Priority Data

Dec. 1, 2001 (KR) .................... 2001-0075689

(51) Int. Cl.[7] .................. H01L 21/00; H01L 21/8242
(52) U.S. Cl. .................. 438/253; 438/254; 438/396; 438/397; 438/3; 438/240
(58) Field of Search ................ 438/253–256, 438/396–399

(56) References Cited

U.S. PATENT DOCUMENTS

| 6,462,368 B2 | * | 10/2002 | Torii et al. ............... 257/295 |
| 6,531,729 B2 | * | 3/2003 | Tsuzumitani et al. ....... 257/309 |
| 2003/0020122 A1 | * | 1/2003 | Joo et al. ................. 257/381 |

FOREIGN PATENT DOCUMENTS

JP    12332213    11/2000

* cited by examiner

Primary Examiner—Thanh Nguyen
(74) Attorney, Agent, or Firm—Harness, Dickey & Pierce, P.L.C.

(57) ABSTRACT

A method of fabricating a metal-insulator-metal (MIM) capacitor of a semiconductor device having an upper and lower electrode formed of metal is provided. Portions of a conductive layer for a lower electrode on inner walls of holes are not removed. Portions of the conductive layer for a lower electrode outside the holes are selectively etched back and node-separated.

43 Claims, 15 Drawing Sheets

METHOD OF FABRICATING A MIM CAPACITOR USING ETCHBACK

CROSS REFERENCE TO RELATED APPLICATIONS

This U.S. nonprovisional application claims priority under 35 U.S.C. §119 to Korean Patent Application No. 2001-75689 filed Dec. 1, 2001, the contents of which are incorporated by reference.

BACKGROUND OF THE INVENTION

1. Field of the Invention

The present invention generally relates to a method of fabricating a capacitor of a semiconductor device. In particular, the present invention relates to a method of fabricating a metal-insulator-metal (MIM) capacitor having an upper and lower electrode formed of metal.

2. Description of the Related Art

As the integration density of semiconductor devices increases, it becomes difficult to obtain a sufficient cell capacitance in limited areas of semiconductor devices, such as DRAMs. Several methods of increasing cell capacitance in a limited area have been suggested, including a method of making a dielectric layer into a thin film, a method of using a material having a high dielectric constant as the dielectric layer, and a method of increasing the effective area of an electrode by making a cylinder-type electrode, a fin-type electrode, or by growing hemispherical grains (HSGS) on the surface of the electrode. However, if the dielectric layer is an existing oxide/nitride/oxide (ONO) layer, it is very difficult to obtain the cell capacitance required for the operation of Gigabit semiconductor devices. As a result, a study using dielectric materials (e.g., metal oxides such as $Ta_2O_5$ and TaON, which has a dielectric constant up to several hundred times greater than the ONO layer) and high dielectric materials (e.g., (Ba, Sr)$TiO_3$(BST), $SrTiO_3$, $BaTiO_3$, (Pb, Zr)$TiO_3$(PZT), and (Pb, La, Zr)$TiO_3$(PZT)) is currently in progress.

Unfortunately, polysilicon electrodes react with these dielectric layers, which deteriorates the electrical characteristics of the capacitor. To solve this problem, a low dielectric layer such as a SiON layer can be added to inhibit the reaction between the polysilicon electrode and the dielectric layer. However, adding such a SiON layer increases the actual thickness of the dielectric layer. Therefore, there is a limit in how much the capacitance can be increased by using a SiON layer and high dielectric materials together.

Accordingly, it is preferable to fabricate a metal-insulator-metal (MIM) capacitor having a dielectric layer formed of a high dielectric material and an upper and lower electrode formed of metal, which does not react with the dielectric layer. Preferably, the metal electrode is formed of a Pt-based noble metal, an oxide of the Pt-based noble metal, or a conductive oxide. Due to the difference between the inherent work functions of the metal electrode and the dielectric layer, a leakage current barrier layer is formed on the interface between the metal electrode and the dielectric layer. As a result, leakage current is controlled. Therefore, even though a low dielectric layer to inhibit the reaction between the electrode and the dielectric layer is not coated, stable leakage current characteristics can be obtained. Also, capacitance can be increased by thinning the dielectric layer.

Currently, in order to fabricate a MIM capacitor having a lower electrode with a concave or cylindrical structure, a node-separation step must be performed as described below with reference to FIGS. 1–3.

Referring first to FIG. 1, a dielectric layer pattern 20 defining a plurality of holes 15 is formed on a lower layer 10. The entire surface of the resultant structure is coated with a conductive layer 25 for a lower electrode. The holes 15 are then filled with an oxide layer that has excellent gap-filling characteristics to form a capping layer 30 to prevent the conductive layer 25 on the inner walls of the holes 15 from being etched in a subsequent process.

Referring now to FIG. 2, the capping layer 30 and the conductive layer 25 are sequentially removed by etch-back or chemical mechanical polishing (CMP) until the upper surface of the dielectric layer pattern 20 is exposed. As depicted in FIG. 2, the conductive layer 25 for a lower electrode on the dielectric layer pattern 20 is completely removed, i.e., the conductive layer 25 is node-separated. As a result, lower electrodes 25a, which are separated from each other, are formed and capping layers 30a remain in the holes 15.

As shown in FIG. 3, the remaining capping layers 30a are removed. Because the capping layers 30a are mainly formed of an oxide, the capping layers 30a are removed by wet etching. However, wet etching has no etching selectivity between the capping layers 30a and the dielectric layer pattern 20. Consequently, the dielectric layer pattern 20 is removed at the same time that the capping layers 30a are removed. As a result, the edges of the lower electrodes 25a protrude above the dielectric layer pattern 20a.

In the situation where a capacitor having a cylindrical structure is desired, the entire dielectric layer pattern 20 is removed. When the capacitor has a cylindrical structure, the protrusion of the edges of the lower electrodes 25a is not a problem. On the other hand, if the edges of the lower electrodes 25a protrude in a capacitor having a concave structure, the leakage current characteristic may be deteriorated.

Furthermore, if node-separation is performed by the current method as described above, additional steps of 1) of forming the capping layer 30 formed of a material having excellent gap-filling characteristics and 2) removing the capping layers 30a remaining in the holes 15 after node-separation are needed. Therefore, the current process of fabricating a capacitor is both complicated and time consuming. Moreover, the production cost is high in node-separation according to chemical mechanical polishing.

It is therefore desirable to provide a method of fabricating a semiconductor material that overcomes the disadvantages of the known prior art.

SUMMARY OF THE INVENTION

The present invention provides a method of fabricating a metal-insulator-metal (MIM) capacitor by a simple fabricating process having a low production cost.

In an exemplary embodiment of the method of the present invention, insulating layer patterns defining a plurality of holes are formed on a semiconductor substrate. A conductive layer for the lower electrodes is formed on the entire surface of the resultant structure to a thickness that does not completely fill the holes. Capacitor lower electrodes which are separated from each other are formed by etching back portions of the conductive layer on the upper surfaces of the insulating layer patterns. No additional layer for filling the holes is necessary in exemplary embodiments of the present invention. A dielectric layer and an upper electrode are formed on the lower electrodes.

In the method according to an exemplary embodiment of the present invention, to node-separate the conductive layer by etching back portions of the conductive layer on the upper surface of the insulating layer patterns without the additional step of adding an additional layer such as a capping layer as is common in the prior art, it is preferable to use plasma containing at least one gas that is capable of selectively chemically etching portions of the conductive layer on the upper surfaces of the insulating layer. For example, when the conductive layer is a Ru layer, portions of the Ru layer on the upper surfaces of the insulating layer patterns are etched back using plasma containing oxygen. In an exemplary embodiment of the present invention, it is preferred that the pressure of the plasma is maintained at 10–100 mTorr to maximize the chemical etch. In an exemplary embodiment of the present invention, it is also preferable that plasma distribution is controlled so that only portions of the conductive layer on the upper surfaces of the insulating layer patterns are removed.

In addition, bias may be applied to the semiconductor substrate during the etch-back of the portions of the conductive layer on the upper surfaces of the insulating layer patterns. In an exemplary embodiment of the present invention, the power of the bias is maintained at 10–200 W. Etch by-products occurring during the etch-back of the conductive layer are attracted to the semiconductor substrate due to the bias applied to the semiconductor substrate and are deposited on portions of the conductive layer located on the inner walls of the holes. The deposited etch by-products protect the conductive layer on the inner walls of the holes and reduce the likelihood the conductive layer will be etched back. As a result, the portions of the conductive layer on the inner walls of the holes are not removed. Portions of the conductive layer outside the holes, i.e., on upper surfaces of insulating layer patterns, are removed without having to add an additional layer such as an existing capping layer as in the prior art methods. As a result, lower electrodes are formed.

After the lower electrodes are formed by applying the bias to the semiconductor substrate, the etch by-products may be removed by a thermal treatment in a reducing gas atmosphere. Preferably, the reducing gas is argon, nitrogen, hydrogen, or a combination thereof. Alternatively, the etch by-products may be removed by thermal treatment in a vacuum atmosphere.

Because the step of forming/removing an additional layer such as a capping layer is omitted, the fabrication process of the present invention in exemplary embodiments is simplified and the production cost is lowered. Additionally, unlike the prior art methods which results in a protrusion of the edges of the lower electrodes which often occurs when the capping layer is removed, leakage current can be reduced due to the lack of protrusion of the edges of the lower electrodes above an insulating layer.

BRIEF DESCRIPTION OF THE DRAWINGS

The present invention will become more apparent by describing in detail exemplary embodiments thereof with reference to the attached drawings in which.

DETAILED DESCRIPTION OF THE INVENTION

Figure 1:
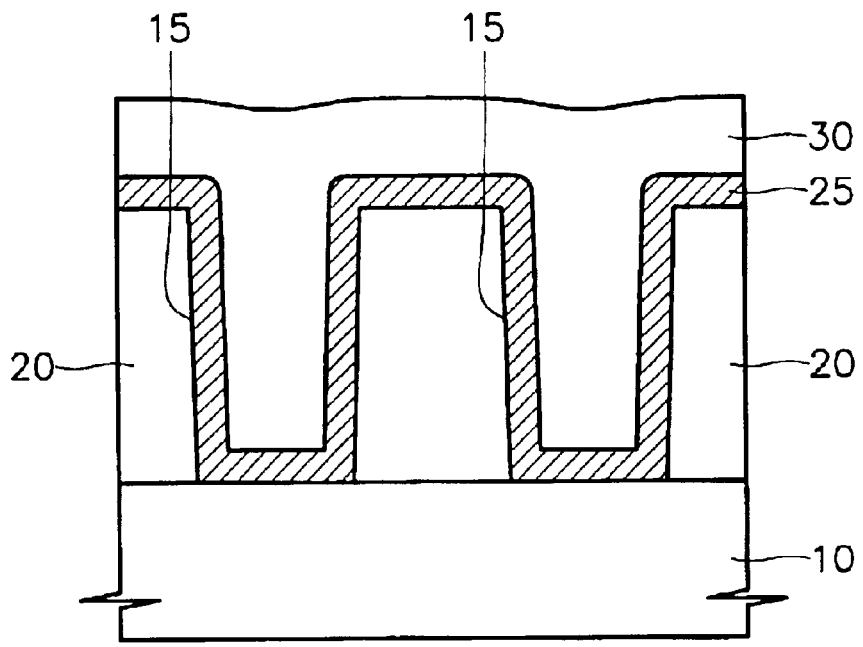
FIGS. 1–3 are cross-sectional views depicting a conventional node-separation step of a method of fabricating a capacitor.

Hereinafter, embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. In drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

First Embodiment

FIGS. 4–13 are cross-sectional views depicting the method of fabricating a capacitor according to a first embodiment of the present invention. In this embodiment, a capacitor having a concave structure is formed by node-separation by etch-back without the additional steps of adding/removing an additional layer such as a conventional capping layer.

Figure 4:
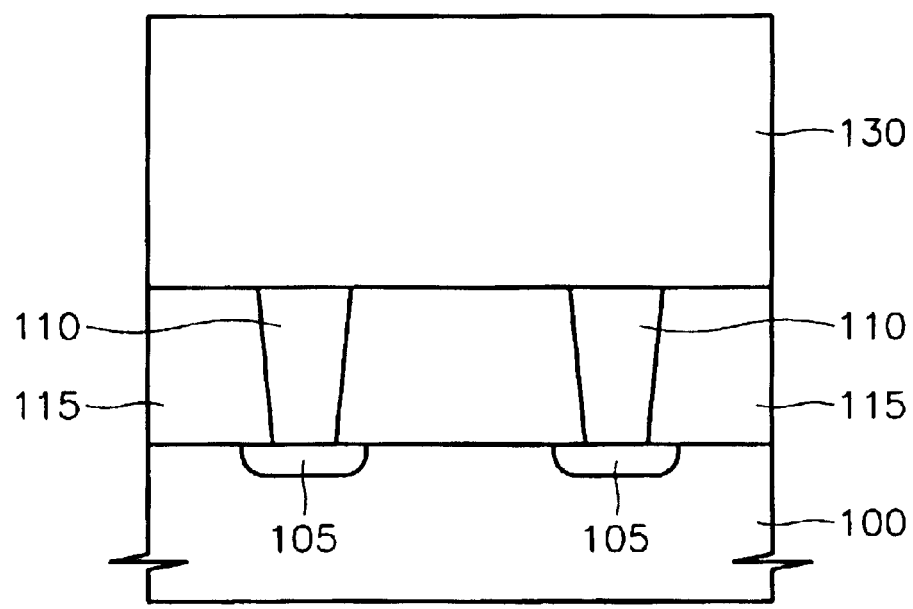
FIGS. 4–13 are cross-sectional views depicting a method of fabricating a capacitor according to a first embodiment of the present invention.

Referring first to FIG. 4, a lower insulating layer 115 is formed on a semiconductor substrate 100. A plurality of contact plugs 110, which penetrate through the lower insulating layer 115 to contact impurity regions 105 in the semiconductor substrate 100, are formed. An insulating material such as boron phosphorus silicate glass (BPSG), phosphorus silicate glass (PSG), plasma enhanced (PE)-tetra ethyl ortho silicate (TEOS), or high density plasma (HDP) oxide is then deposited on the contact plugs 110 and the lower insulating layer 115 to form an insulating layer 130.

Figure 5:
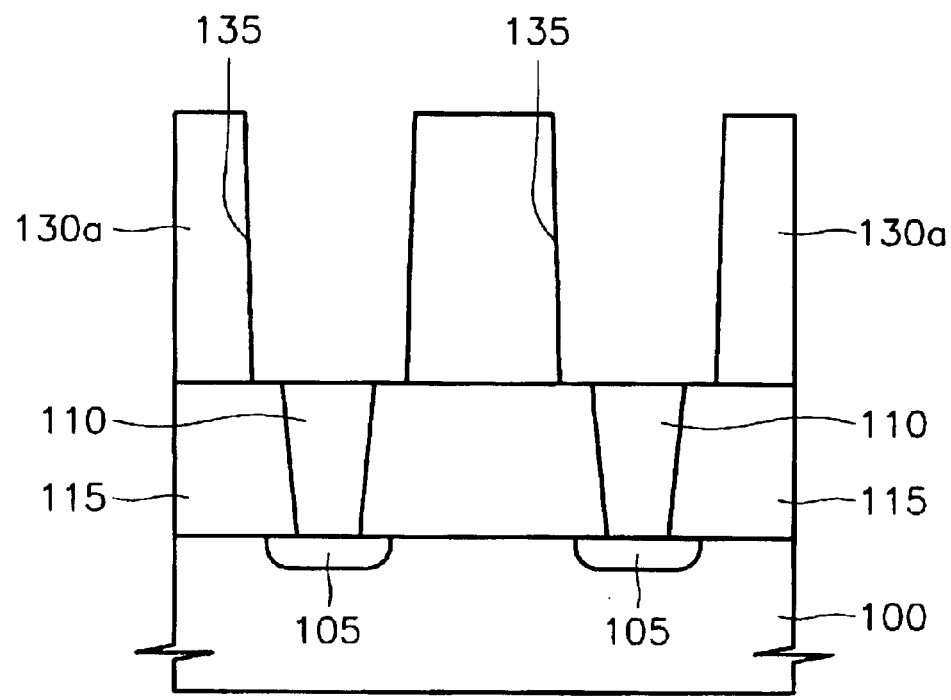

Referring next to FIG. 5, a portion of the insulating layer 130 is etched to form insulating layer patterns 130a for defining a plurality of holes 135 which expose the upper surfaces of the contact plugs 110 and the upper portions of the lower insulating layer 115 around the contact plugs 110.

Figure 6:
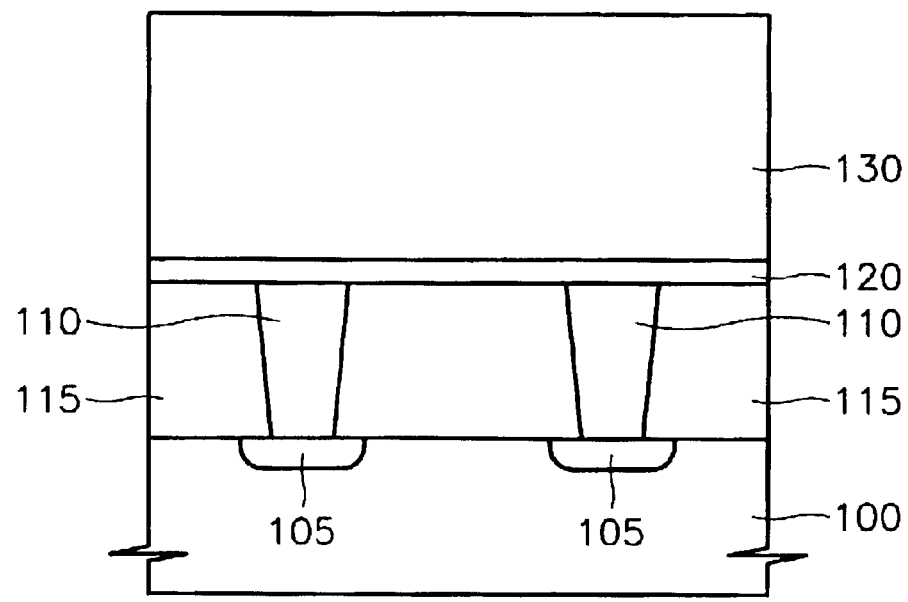

Alternatively, as is shown in FIG. 6, an etch stopper 120 may be formed on the contact plugs 110 and the lower insulating layer 115 before the insulating layer 130 is formed. The etch stopper 120 is formed of a material having different etching selectivity from the insulating layer 130, such as, for example, nitride.

Hereinafter, a process performed for the resultant structure shown in FIG. 7 will be described, but the process may be also performed for the resultant structure shown in FIG. 5.

Figure 7:
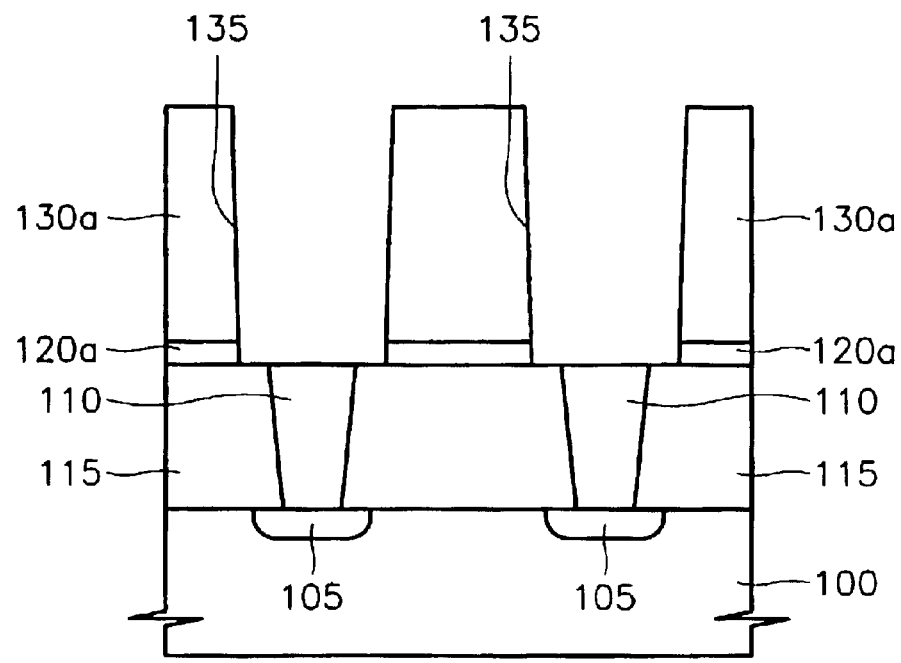

As shown in FIG. 7, to form the insulating layer patterns 130*a* for defining the plurality of holes 135, a portion of the insulating layer 130 is etched until the upper surface of the etch stopper 120 is exposed. The etch stopper 120 protects the lower insulating layer 115 from being etched. Etching is then performed so that only the etch stopper 120 is removed. Thus, holes 135 for exposing the contact plugs 110 and the lower insulating layer 115 around the contact plugs 110 are formed. As depicted in FIG. 7, etch stopper patterns 120*a* remain underneath the insulating layer patterns 130*a*.

If a capacitor having a cylindrical structure is desired, a capacitor lower electrode is formed and the insulating layer patterns 130*a* are completely removed. The etch stopper patterns 120*a* protect the lower insulating layer 115 from being etched. The etch stopper patterns 120*a* sustain a high capacitor lower electrode at the sides of the high capacitor lower electrode. Consequently, a capacitor excellent in mechanical strength can be obtained.

Figure 8:
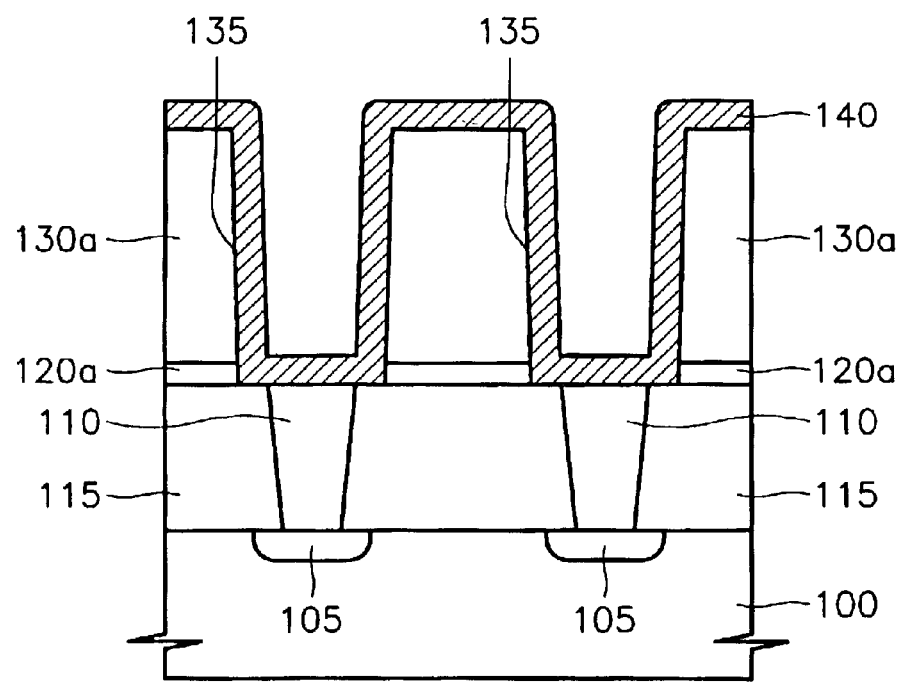

Referring now to FIG. 8, a conductive layer 140 for a capacitor lower electrode is formed on the resultant structure of FIG. 7 to a thickness that does not completely fill the holes 135. The conductive layer 140 may preferably be formed of a noble metal, an oxide of the noble metal, a conductive oxide, or a combination thereof. Suitable noble metals include metals such as Pt, Ru, and Ir. Examples of noble metal oxides for use in the present invention include oxides such as PtO, $RuO_2$, and $IrO_2$. Conductive oxides such as (La, Sr)$CoO_3$, $BaSrRuO_3$, $SrRuO_3$, and the like are also preferably used.

The conductive layer 140 may be formed by chemical vapor deposition (CVD) or atomic layer deposition (ALD) having excellent step coverage. To form the conductive layer 140, a seed layer may first be formed by physical vapor deposition (PVD), followed by the formation of the main layer, which may be formed by CVD or ALD. In other words, the conductive layer 140 may be formed by a combination of PVD and CVD or a combination of PVD and ALD.

Figure 9:
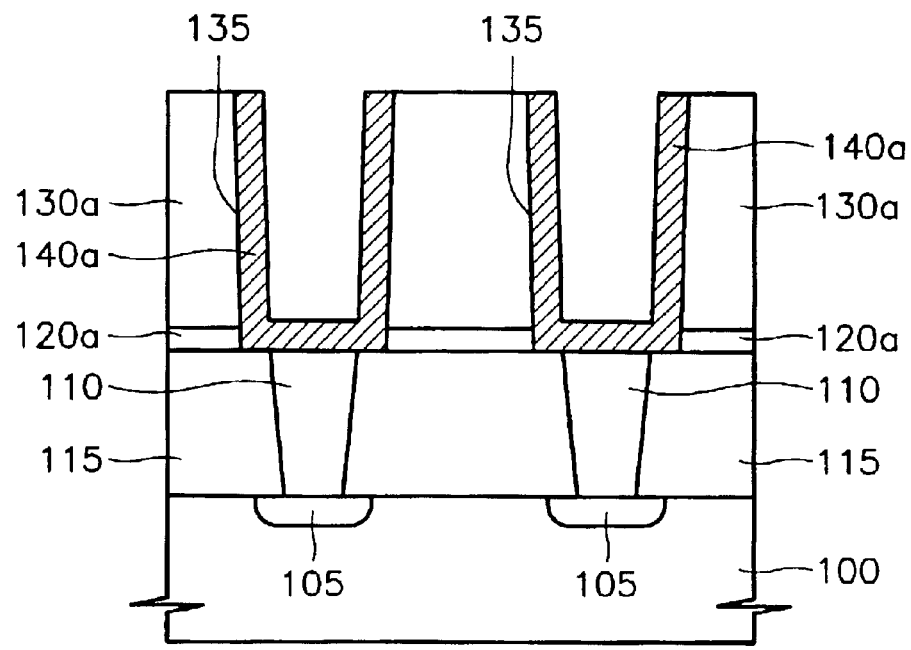

Referring next to FIG. 9, portions of the conductive layer 140 on the upper surfaces of the insulating layer patterns 130*a* are etched back to form lower electrodes 140*a*, which are separated from each other. Preferably plasma having at least one gas that is capable of selectively chemically etching the portions of the conductive layer 140 on the upper surfaces of the insulating layer patterns 130*a* is used. For example, if the conductive layer 140 is formed of Ru, the conductive layer 140 is etched back by using plasma containing oxygen. Alternatively, depending on the composition of the conductive layer 140, plasma containing a chlorine-based gas may be used. It is preferable that the pressure of the plasma is maintained at 10–100 mTorr to maximize the chemical etch. Additionally, it is preferable that the plasma distribution is controlled so that portions of the conductive layer 140 on the upper surfaces of the insulating layer patterns 130*a* are removed but portions of the conductive layer 140 on the inner walls of the holes 135 are not removed. By controlling the distribution of the plasma, ions of the plasma do not reach the portions of the conductive layer 140 on the inner walls of the holes 135. As a result, the portions of the conductive layer 140 on the inner walls of the holes 135 are prevented from being removed by etch-back. Thus, only the portions of the conductive layer 140 on the upper surfaces of the insulating layer patterns 130*a* are selectively removed and node-separated. The temperature of plasma may be a low temperature of from 10 to 40° C. or a high temperature of from 50 to 250° C.

Figure 10:
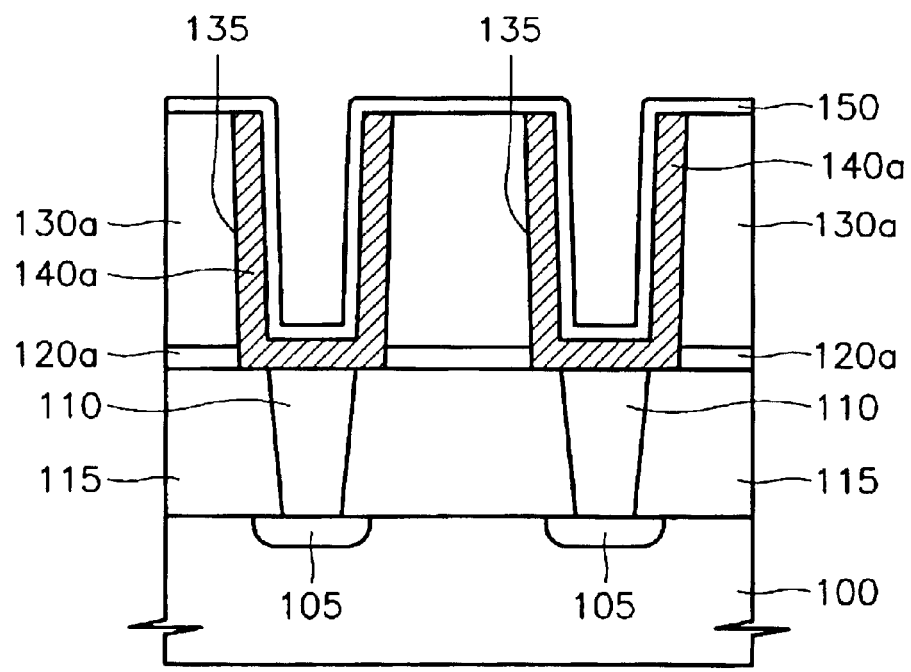

Referring now to FIG. 10, a dielectric layer 150 is formed on the lower electrodes 140*a*. Preferably, the dielectric layer 150 is formed of a metal oxide such as $Ta_2O_5$ or $Al_2O_3$, or a high dielectric material having a perovskite structure such as (Ba, Sr)$TiO_3$(BST), $SrTiO_3$, $BaTiO_3$, (Pb, Zr)$TiO_3$(PZT), and (Pb, La, Zr)$TiO_3$(PLZT). Alternatively, the dielectric layer 150 may be formed of TaON. Further, the dielectric layer 150 may be a composite layer, which is formed of combinations of the above materials may be formed by CVD or ALD having excellent step coverage, a combination of PVD and CVD, or a combination of PVD and ALD.

Figure 11:
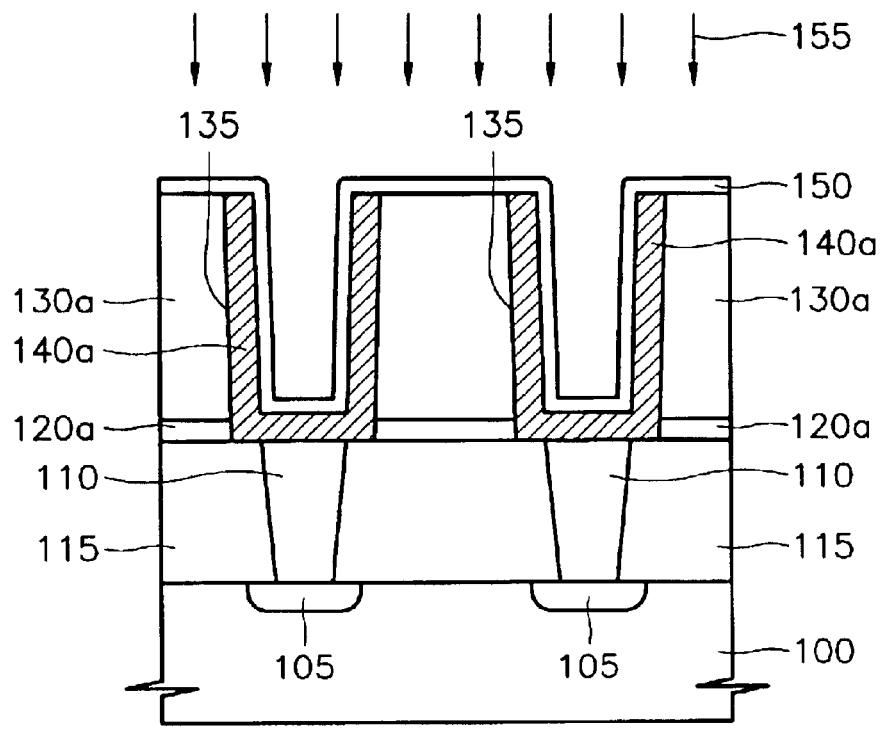

An optional treatment step 155 for the dielectric layer 150 may be performed to improve the electrical characteristics of the dielectric layer 150 as is shown in FIG. 11. For example, the resultant structure of FIG. 10 can be ozone-treated, plasma-treated in a gas atmosphere containing oxygen or nitrogen, or thermal-treated in a gas atmosphere containing oxygen or nitrogen. The treatment step 155 may be performed in one step or in multiple steps.

If the temperature for forming the dielectric layer described with reference to FIG. 10 is too high, the lower electrode is oxidized or the deposited crystal grains of the dielectric layer become too large, and, as a result, the surface of the dielectric layer becomes rough. Thus, it is preferable that the temperature for forming the dielectric layer is not too high. The temperature is optimally maintained at about 400° C. so that an amorphous dielectric layer is deposited and thermal-treated as described above with reference to FIG. 11. As a result, a dielectric layer having an improved electrical characteristic is obtained. The temperature for crystallizing the dielectric layer is preferably maintained at 500–800° C.

Figure 12:
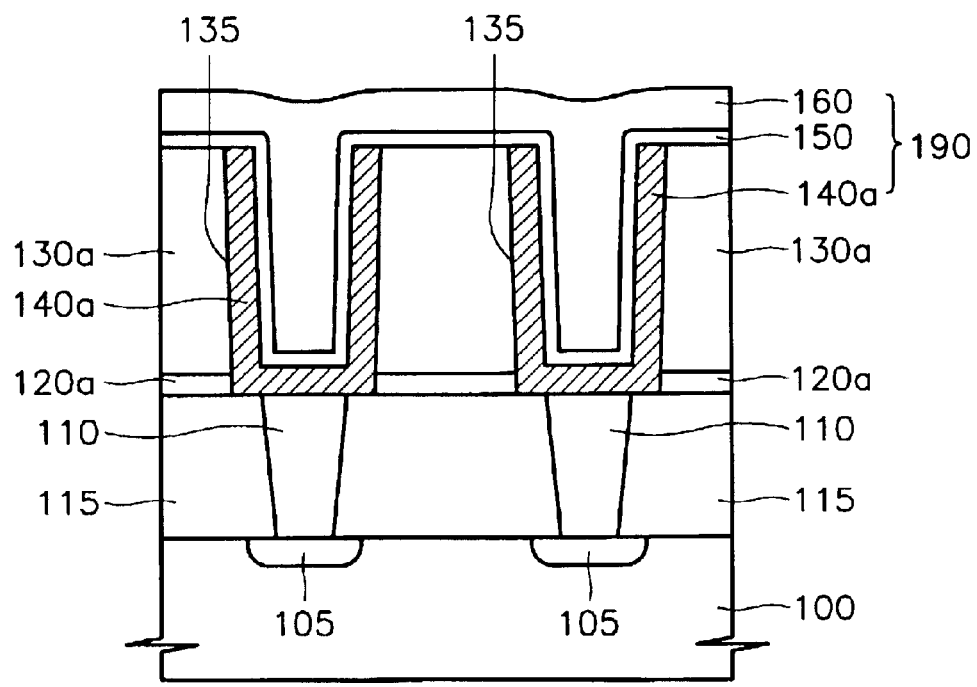

Referring to FIG. 12, an upper electrode 160 is formed on the dielectric layer 150. As a result, a capacitor 190 including the lower electrodes 140*a*, the dielectric layer 150, and the upper electrode 160 is formed. The upper electrode 160 is preferably formed of a noble metal, an oxide of the noble metal, a conductive oxide, or a combination thereof. The noble metal includes metals such as Pt, Ru, Ir, and the like. Suitable conductive oxides include (La, Sr)$CoO_3$, $BaSrRuO_3$, $SrRuO_3$, and the like. The upper electrode 160 may be formed by CVD, ALD, a combination of PVD and CVD, or a combination of PVD and ALD.

Figure 13:
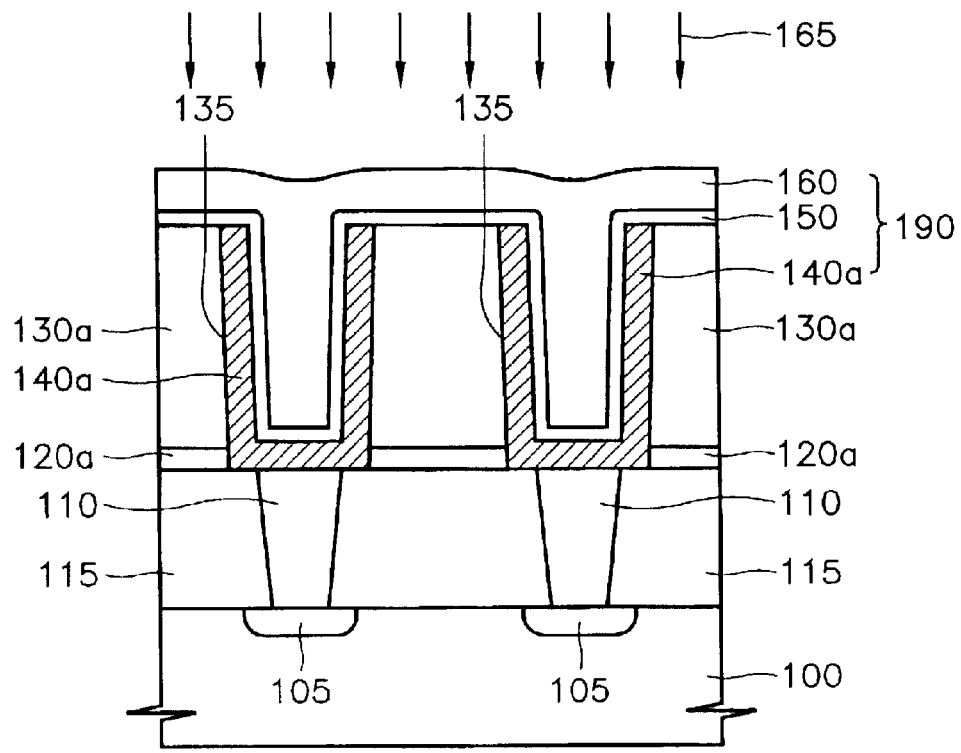

As shown in FIG. 13, an optional curing step 165 of the capacitor 190 may be performed to improve the electrical characteristics of the capacitor 190. The curing step 165 is performed by thermal-treating the resultant structure shown in FIG. 12 at a temperature of 300–600° C. in a gas atmosphere containing oxygen.

In this first embodiment of the present invention, portions of the conductive layer on the insulating layer are removed by etch-back without the additional step of adding or removing an additional layer such as a conventional capping layer. This selective etch-back can be achieved by controlling the distribution of the ions of the etching plasma so that the ions do not reach the portions of the conductive layer on the inner walls of the holes and thus only selectively etch portions of the conductive layer for lower electrodes. Selective etch-back can also be achieved by enhancing the chemical reaction between the plasma ions by increasing the pressure of the etching plasma. Thus, according to this first embodiment, production cost is lowered as compared to CMP. Additionally, because the steps of forming and removing an additional layer is omitted, the fabricating process is simplified.

Second Embodiment

Figure 14:
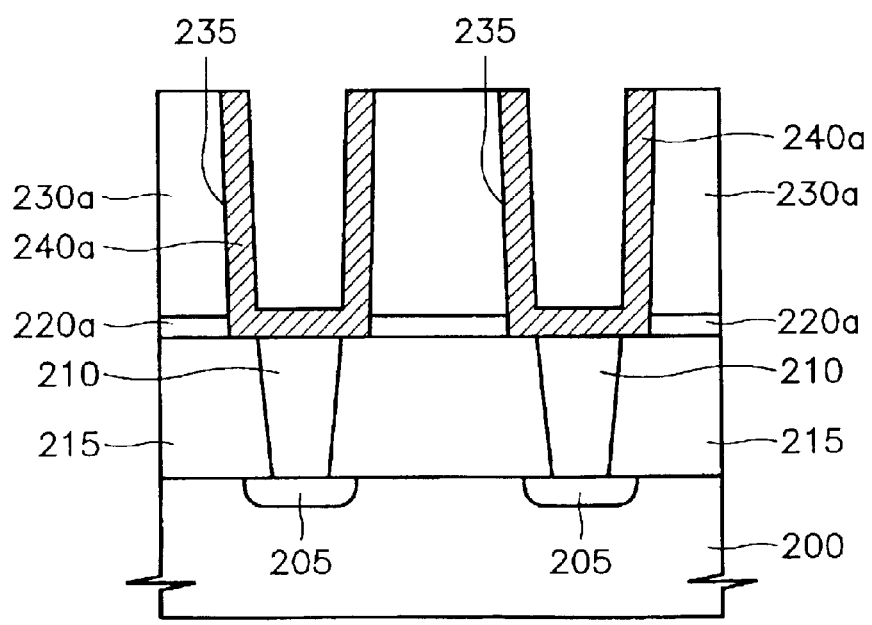
FIGS. 14 and 15 are cross-sectional views depicting a method of fabricating a capacitor according to a second embodiment of the present invention.
Figure 15:
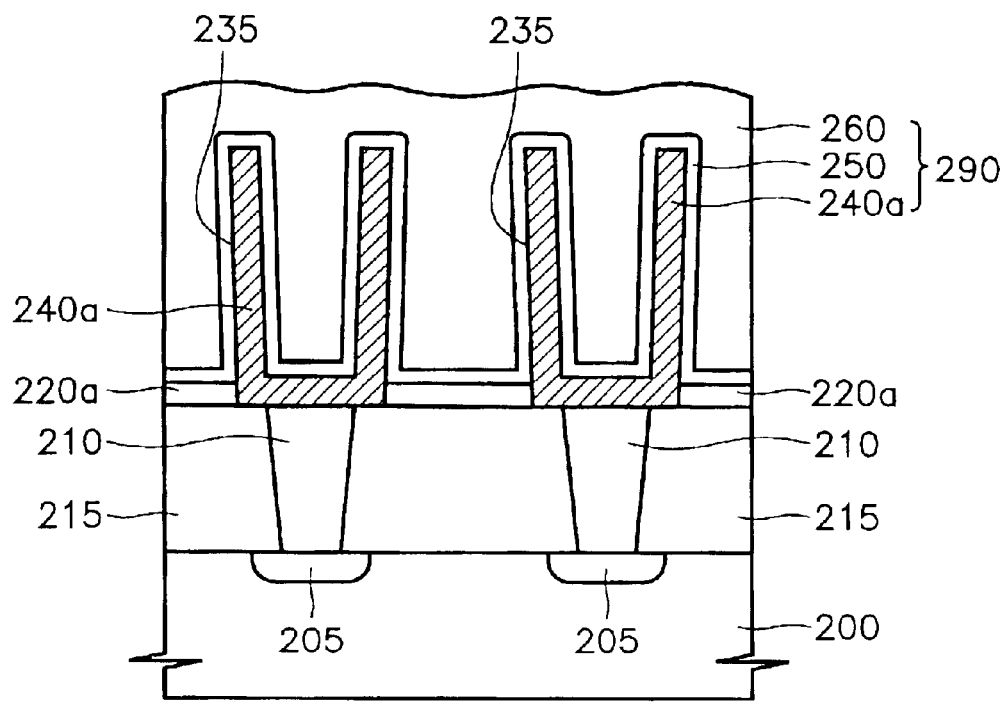

FIGS. 14 and 15 are cross-sectional views depicting the method of fabricating a capacitor according to a second embodiment of the present invention. In this embodiment, a capacitor having a cylindrical structure is formed by node-separation by etch-back without the addition or removal of an additional layer such as a conventional capping layer. This embodiment is virtually identical to the first embodiment described above except that a capacitor having a cylindrical structure is fabricated instead of a capacitor having a concave structure. Accordingly, repetitive descriptions have not been included.

Referring first to FIG. 14, it is to be noted that the steps described above with reference to FIGS. 4–9 in the first embodiment are performed. In particular, a lower insulating layer 215 is formed on a semiconductor substrate 200. A plurality of contact plugs 210, which penetrate through the lower insulating layer 215 to contact impurity regions 205 in the semiconductor substrate 200, are formed. An etch stopper is formed on the contact plugs 210 and the lower insulating layer 215. An insulating layer having a different etch selectivity from the etch stopper is then formed. The etch stopper and the insulating layer are etched to form insulating layer patterns 230a and etch stopper patterns 220a for defining a plurality of holes 235 exposing the contact plugs 210 and upper surfaces of the lower insulating layer 215 around the contact plugs 210. A conductive layer for a capacitor lower electrode is then formed on the entire surface of the resultant structure to a thickness that does not completely fill the holes 235. Portions of the conductive layer on the upper surfaces of the insulating layer patterns 230a are etched back to form capacitor lower electrodes 240a, which are separated from each other.

Referring now to FIG. 15, the insulating layer patterns 230a are removed. Here, the etch stopper patterns 220a protect the lower insulating layer 215 from being etched. The steps described above with reference to FIGS. 10–13 in the first embodiment are performed to form a capacitor 290 including the lower electrode 240a, the dielectric layer 250, and the upper electrode 260.

As with the first embodiment, the fabricating process is simplified and the production cost is lowered as compared to CMP due to the omission of the steps of adding and removing an additional layer such as a capping layer. In this embodiment, lower electrodes are formed into a cylindrical structure, thereby maximizing the effective area of the lower electrodes. As a result, cell capacitance is increased.

Third Embodiment

FIGS. 16–19 are cross-sectional views depicting the method of fabricating a capacitor according to a third embodiment of the present invention. In this embodiment, bias is applied to a semiconductor substrate during etch-back to deposit etch by-products on portions of the conductive layer on the inner walls of the holes. Consequently, the portions of the conductive layer on the inner walls of the holes having the deposited by-products are prevented from being etched.

Figure 16:
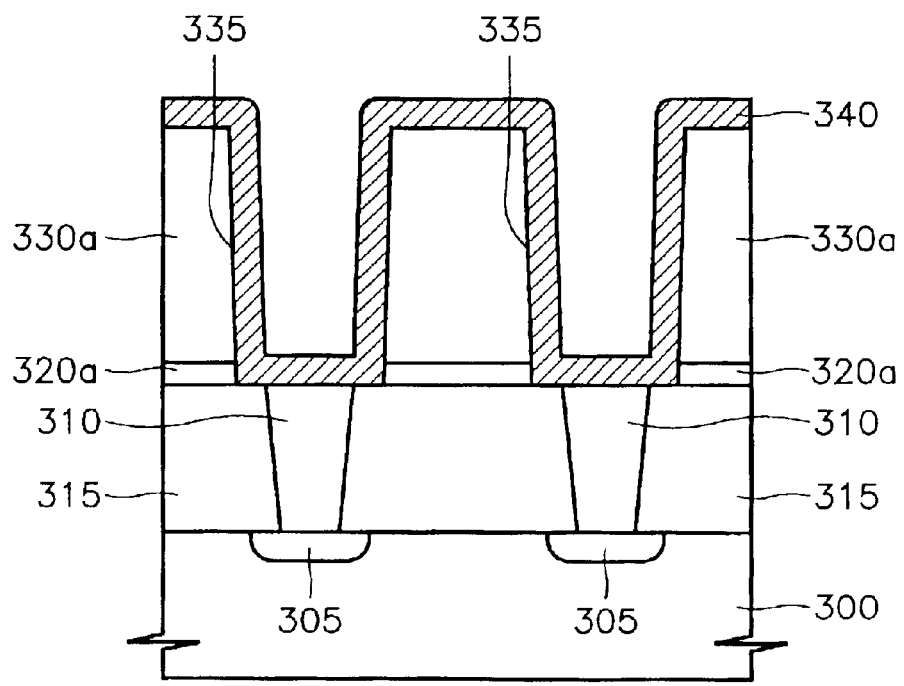
FIGS. 16–19 are cross-sectional views depicting a method of fabricating a capacitor according to a third embodiment of the present invention.

Referring first to FIG. 16, the steps described with reference to FIGS. 4–8 in the first embodiment are performed. More particularly, a lower insulating layer 315 is formed on a semiconductor substrate 300. A plurality of contact plugs 310, which penetrate through the lower insulating layer 315 to contact impurity regions 305 in the semiconductor substrate 300, are formed. An etch stopper is formed on the contact plugs 310 and the lower insulating layer 315. An insulating layer having different etch selectivity from the etch stopper is formed. The etch stopper and the insulating layer are etched to form insulating layer patterns 330a and etch stopper patterns 320a for defining a plurality of holes 335 exposing the contact plugs 310 and upper surfaces of the lower insulating layer 315 around the contact plugs 310. A conductive layer 340 for a capacitor lower electrode is formed on the entire surface of the resultant structure to a thickness that does not completely fill the holes 335.

Figure 17:
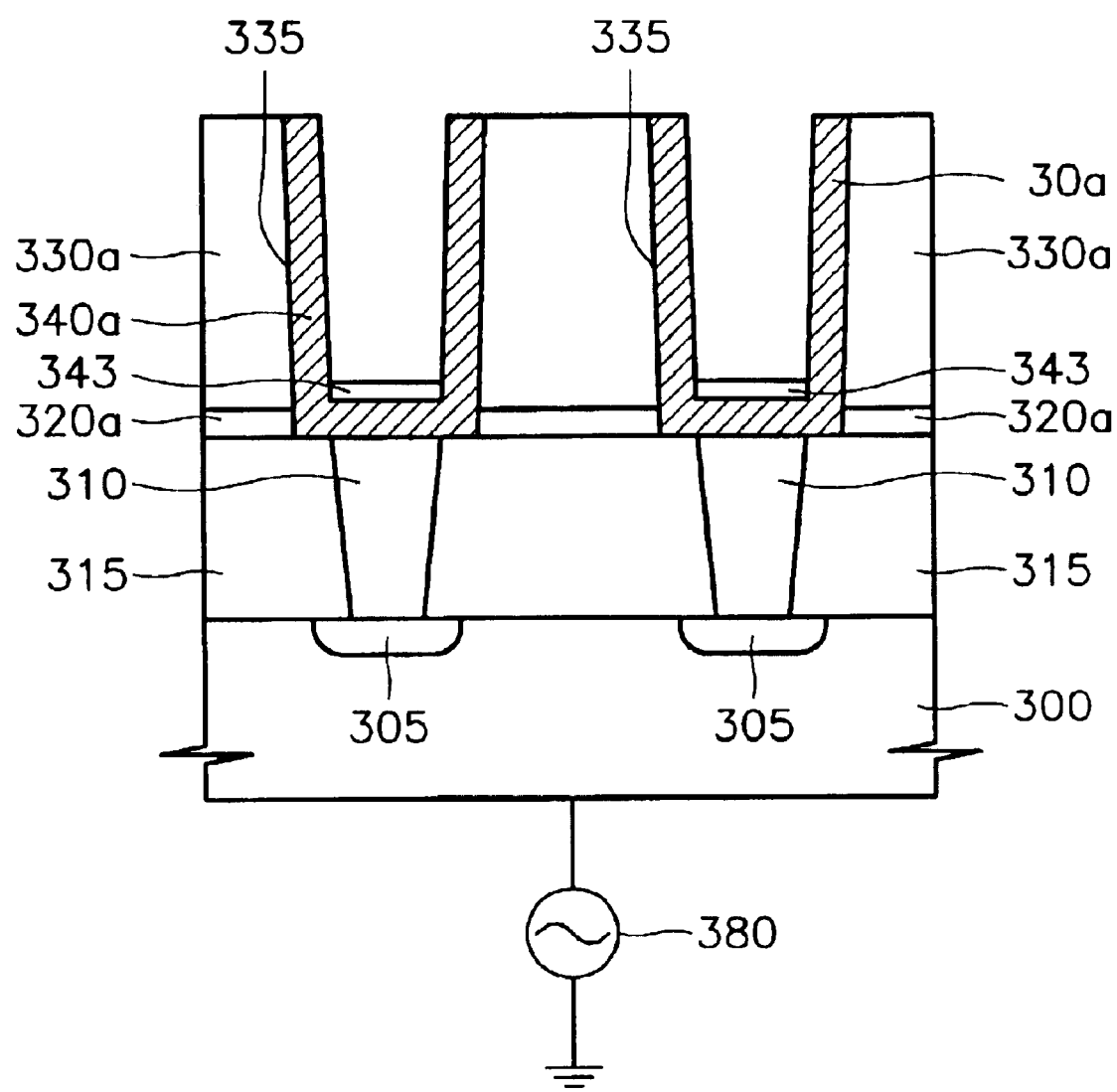

Referring next to FIG. 17, capacitor lower electrodes 340a, which are separated from each other, are formed as described above with reference to FIG. 9 in the first embodiment by connecting a bias power 380 to the semiconductor substrate 300 to apply bias to the semiconductor substrate 300. Bias is applied to the semiconductor substrate 300 to deposit etch by-products 343 on the inner walls of the holes 335. Consequently, portions of the conductive layer 340 on the upper surfaces of the insulating layer patterns 330a are etched back without the need for the addition of an additional layer for filling the holes 335. The power of the bias power 380 is preferably maintained at 10–200 W.

Etch by-products 343 occurring during the etch-back have polarity and are therefore deposited on portions of the conductive layer 340 on the inner walls of the holes. Due to the bias applied to the semiconductor substrate 300, the etch by-products 343 are particularly drawn to the bottoms of the holes 335. The deposited etch by-products 343 protect the portions of the conductive layer 340 on the inner walls of the holes 335 from being etched back. Exposed portions of the conductive layer 340 are etched back using the deposited etch by-products 343 as an etch mask to selectively remove only the portions of the conductive layer 340 on the upper surfaces of the insulating layer patterns 330a. Thus, the portions of the conductive layer 340 on the inner walls of the holes 335, i.e., the portions of the conductive layer 340 on which the etch by-products 343 are deposited, are not etched, even though the distribution of plasma is not controlled as in the first embodiment. If the etch by-products 343 do not affect the electrical characteristic of a capacitor, the etch by-products 343 may not be removed.

Figure 18:
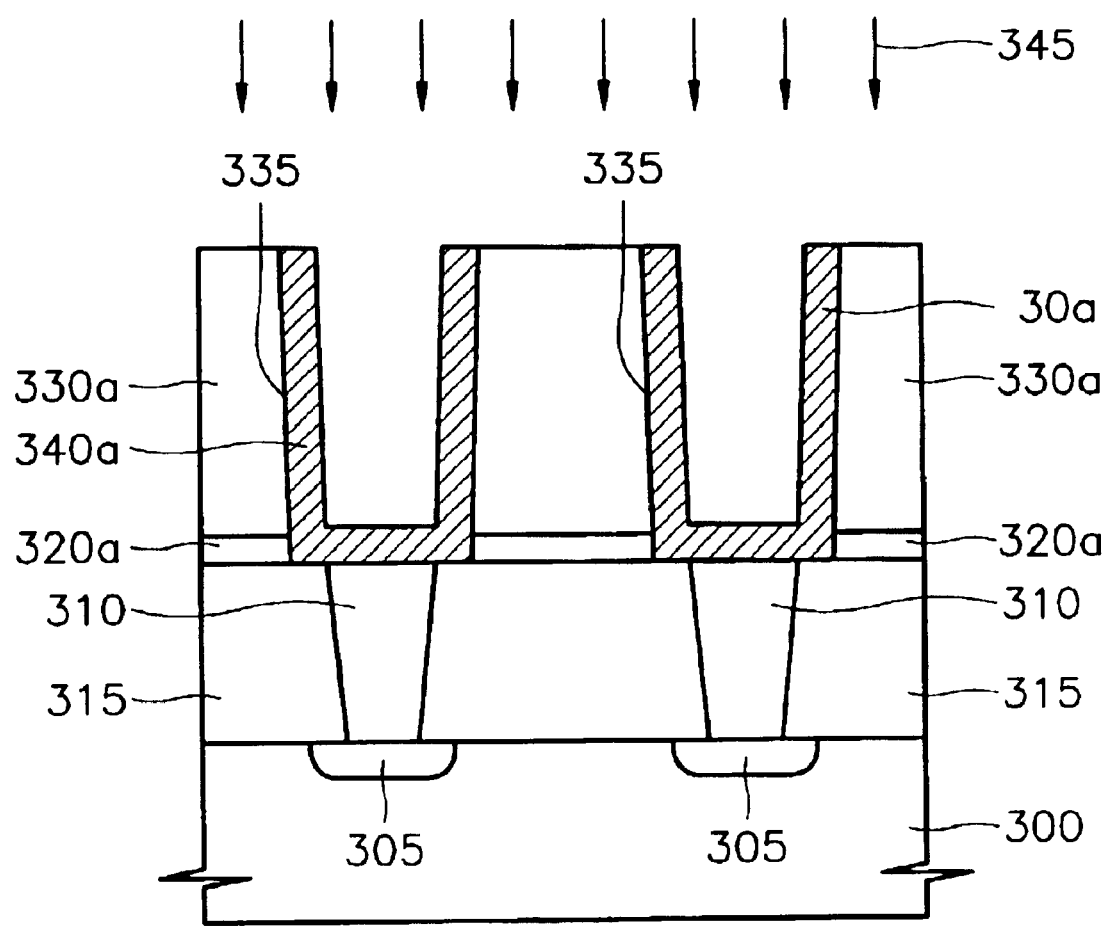

On the other hand, if the etch by-products 343 are to be removed, a thermal treatment in a reducing gas or vacuum atmosphere as is described in FIG. 18 may be used. As shown in FIG. 18, the resultant structure on which the etch by-products 343 are formed is thermal-treated 345 in a reducing gas atmosphere. It is preferable that the reducing gas is argon, nitrogen, hydrogen, or a combination thereof. Plasma may optionally occur in the reducing gas atmosphere. Alternatively, as indicated above, the thermal treatment may be performed in a vacuum atmosphere. In either instance, the temperature of the semiconductor substrate 300 is preferably maintained at over 350° C.

Figure 19:
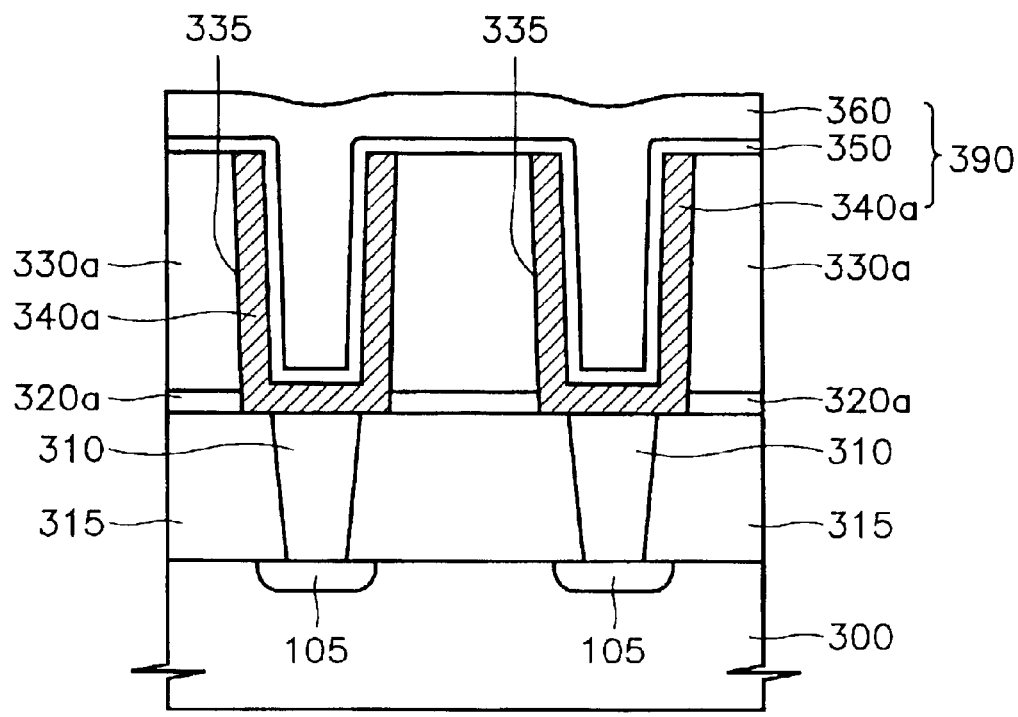

Referring now to FIG. 19, the steps described with reference to FIGS. 10–13 in the first embodiment are performed to fabricate a capacitor 390 having a concave structure including the lower electrodes 340a, the dielectric layer 350, and the upper electrode 360.

In this third embodiment of the present invention, bias is applied to a semiconductor substrate in a node-separation step to deposit etch by-products on the portions of the conductive layer on the inner walls of the holes. As a result, the portions of the conductive layer on the inner walls of the holes are prevented from being etched. Optionally, a step of forming lower electrodes and removing the etch by-products deposited on the inner walls of the holes may also be performed.

As in the previously described embodiments, production cost is lowered and the fabrication process is simplified due to the omission of the step of forming/removing an additional layer such as a capping layer for filling the holes. In addition, because bias is applied to the semiconductor substrate, the time required for to fabricate a capacitor is shortened. Further, since etch by-products are used as an etch mask, only portions of the conductive layer outside the holes may be selectively removed, even though the distribution of plasma is not controlled.

Fourth Embodiment

Figure 20:
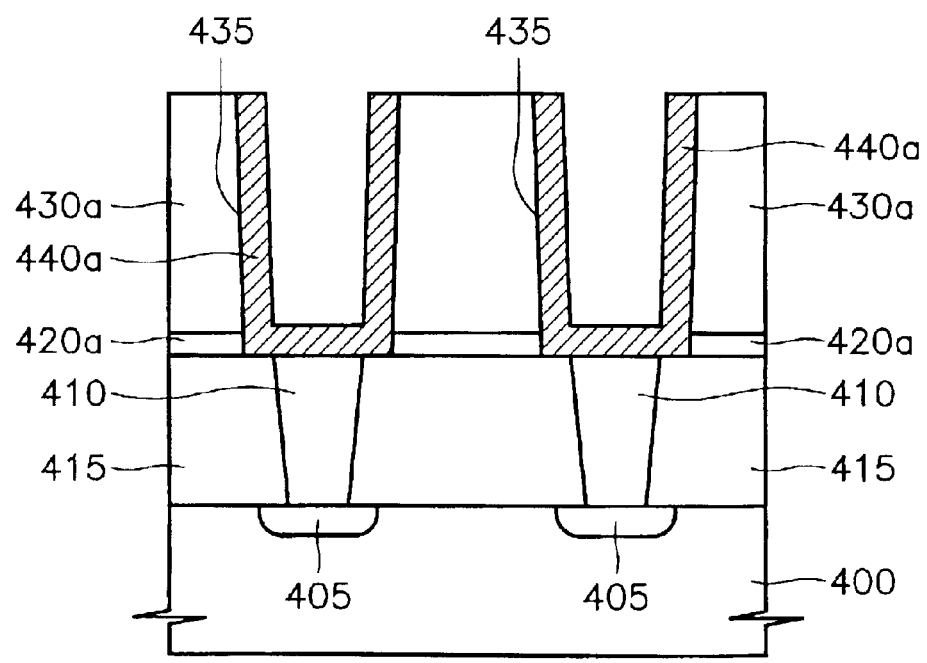
FIGS. 20 and 21 are cross-sectional views depicting a method of fabricating a capacitor according to a fourth embodiment of the present invention.
Figure 21:
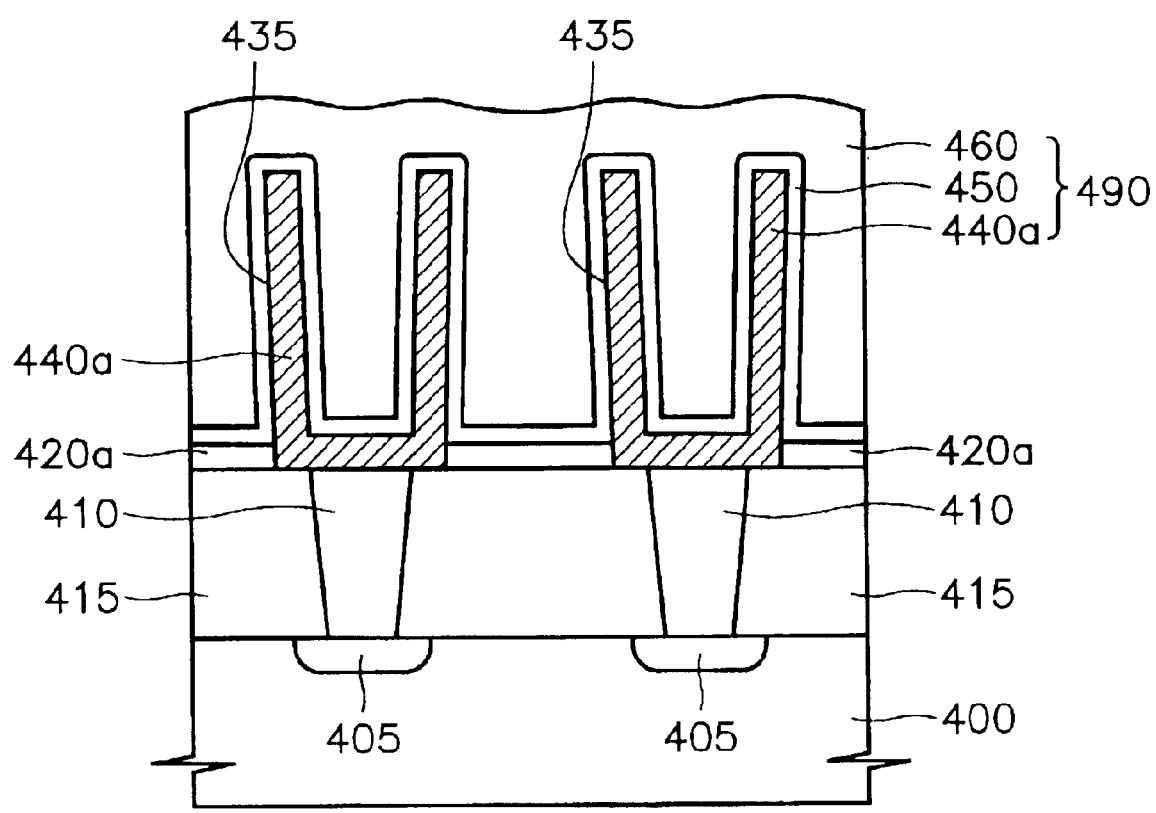

FIGS. 20 and 21 are cross-sectional views depicting a method of fabricating a capacitor according to the fourth embodiment of the present invention. This embodiment is virtually the same as the third embodiment with the exception that a capacitor having a cylindrical structure is formed. As with the embodiments described above, any repetitive descriptions are not included in the following descriptions.

Referring first to FIG. 20, the steps described with reference to FIGS. 16–18 in the third embodiment are performed. For example, a lower insulating layer 415 is formed on a semiconductor substrate 400. A plurality of contact plugs 410 which penetrate through the lower insulating layer 415 to contact impurity regions 405 in the semiconductor substrate 400 are formed. An etch stopper is formed on the contact plugs 410 and the lower insulating layer 415. An insulating layer having a different etch selectivity from the etch stopper is formed on the etch stopper. The etch stopper and the insulating layer are etched to form insulating layer patterns 430a and etch stopper patterns 420a for defining a plurality of holes 435 exposing the contact plugs 410 and upper surfaces of the lower insulating layer 415 around the contact plugs 410. A conductive layer for a capacitor lower electrode is formed on the entire surface of the resultant structure to a thickness which does not completely fill the holes 435. Portions of the conductive layer on the upper surfaces of the insulating layer patterns 430a are etched back to form capacitor lower electrodes 440a, which are separated from each other. Bias is applied to the semiconductor substrate 400 so that etch by-products occurring during the etch-back are deposited on the inner walls of the holes 435, especially to the conductive layer at the bottoms of the holes 435. The etch by-products are removed by thermal treatment in a reducing gas or vacuum atmosphere after the lower electrodes 440a are formed.

Referring to FIG. 21, the lower insulating layer patterns 430a are removed. The etch stopper patterns 420a protect the lower insulating layer 415 from being etched. The steps described with reference to FIGS. 10–13 in the first embodiment are performed to form a capacitor 490 including the lower electrodes 440a, the dielectric layer 450, and the upper electrode 460. A capacitor is thus formed into a cylindrical structure, thereby maximizing the effective area of the lower electrode. As a result, cell capacitance is increased.

According to this embodiment, production cost is lowered. Additionally, because the step of forming/removing an additional layer such as the capping layer for filling the holes is omitted, the process is simplified. Furthermore, bias shortens the time required for fabricating a capacitor. Because the etch by-products are used as an etch mask, the portions of the conductive layer outside the holes may be selectively removed even though the distribution of plasma is not controlled.

Hereinafter, various experiments related to the present invention and the results based on the experiments will be described.

EXPERIMENTAL EXAMPLE 1

An insulating layer was formed of a PE-TEOS layer according to the first embodiment. A conductive layer for a lower electrode was then formed of a Ru layer by CVD. In this example, $Ta_2O_5$ was thinly coated on the PE-TEOS layer before the Ru layer was formed to improve the adhesive characteristic between the Ru and the PE-TEOS layer. Portions of the Ru layer on the upper surfaces of the PE-TEOS layer were etched back using plasma in a gas atmosphere containing oxygen for selectively etching the Ru layer for node-separation. The distribution of plasma was controlled so that only portions of the Ru layer on the PE-TEOS layer were removed. The pressure was maintained at 50 mTorr.

Figure 22:
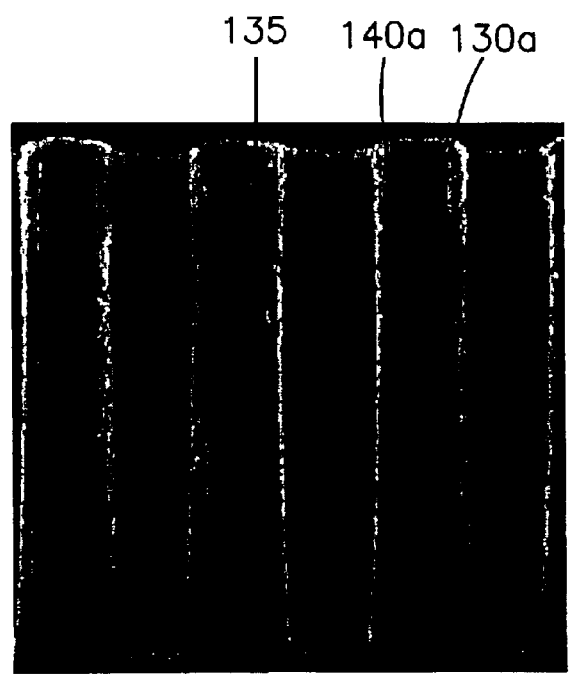
FIG. 22 is a scanning electron microscope photograph of a cross-section of a lower electrode formed according to the first embodiment of the present invention.

FIG. 22 is a scanning electron microscope photograph of a cross-section of the Ru lower electrodes formed according to the first embodiment of the present invention. As shown in FIG. 22, portions of the Ru layer outside the holes 135, i.e., only the portions of the Ru layer on the upper surfaces of the PE-TEOS layer 130a, were selectively removed without the addition or removal of an additional layer such as a capping layer. As a result, a plurality of Ru lower electrodes 140a, which are separated from each other, were formed. Unlike the prior art, edges of the lower electrodes 140a did not protrude above the PE-TEOS layer 130a. Thus, it can be ascertained that leakage current will not be deteriorated.

EXPERIMENTAL EXAMPLE 2

An insulating layer was formed of a PE-TEOS layer according to the third embodiment of the present invention. A conductive layer for a lower electrode was then formed with Ru by CVD. $Ta_2O_5$ was thinly coated on the PE-TEOS layer before the formation of the Ru conductive layer to improve the adhesive characteristic between the Ru and the PE-TEOS layer. Portions of the Ru layer on the upper surfaces of the PE-TEOS layer were etched back without the addition or removal of an additional layer for filling holes using plasma in a gas atmosphere containing oxygen, which selectively etched only the Ru layer for node-separation. As a result, lower electrodes, which are separated from each other, were formed. The pressure was maintained at 50 mTorr.

Figure 23:
FIG. 23 is a scanning electron microscope photograph of a cross-section of a lower electrode formed according to the third embodiment of the present invention.
Figure 24:
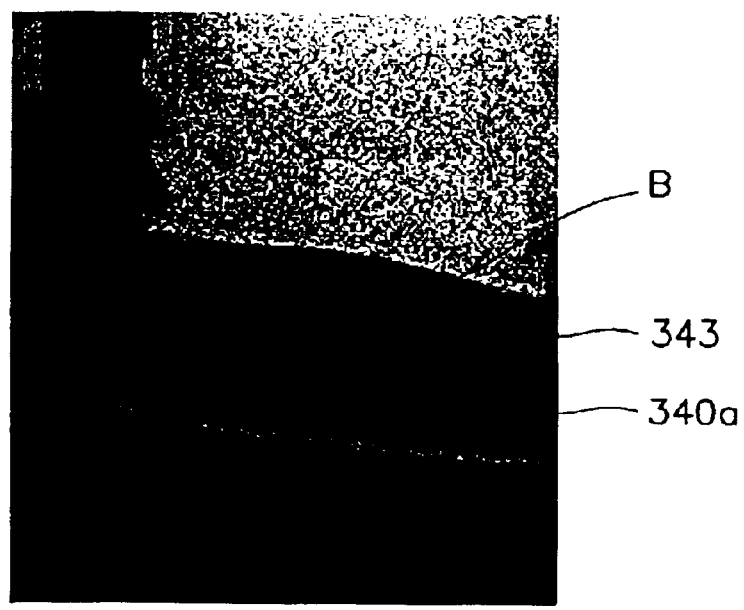
FIG. 24 is a transmission electron microscope photograph of a portion of the cross-section of a lower electrode shown in FIG. 23.

In this example, a bias power was connected to the semiconductor substrate to apply bias having a power of 50 W to the semiconductor substrate. FIG. 23 is a scanning electron microscope photograph of a cross-section of the Ru lower electrodes formed according to the third embodiment of the present invention. FIG. 24 is a transmission electron microscope photograph of the cross-section of portion A shown in FIG. 23. As shown in FIGS. 23 and 24, due to the bias applied to the semiconductor substrate, etch by-products 343 occurring during the etch-back were deposited on the inner walls of the holes 335, particularly on the portions of the Ru layer at the bottoms of the holes 335, i.e., on the lower electrodes 340a. It can be seen in FIG. 23 that the portions of the Ru layer at the bottoms of the holes 335 are not etched.

In this example, only portions of the Ru layer outside the holes 335, i.e., on the upper surfaces of the PE-TEOS layer 330a, were selectively removed. As in the previous example, such selectivity was achieved without the addition or removal of an additional capping layer. As a result, a plurality of lower electrodes 340a, which are separated from each other, were formed. Unlike the prior art methods, edges of the lower electrodes 340a did not protrude above the PE-TEOS layer 330a. Thus, it can ascertained that leakage current will not be deteriorated.

Figure 25:
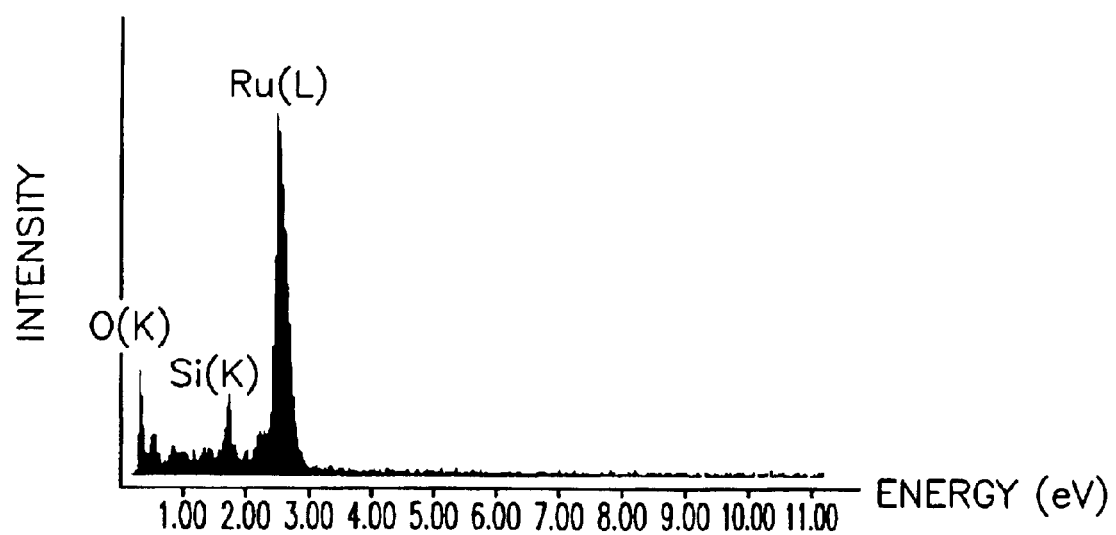
FIG. 25 is graphical illustration showing the result of the EDS analysis of the portion of the cross-section of a lower electrode shown in FIG. 24.

FIG. 25 is a graphical illustration showing the result of EDS analysis performed on the portion B shown in FIG. 24. As seen in FIG. 25, only Ru and O were detected as components of etch by-products 343. This is because $RuO_3$ or $RuO_4$ by-products are deposited on portions of the Ru layer on the inner walls of the holes 335 due to the bias applied to the semiconductor substrate while portions of the Ru conductive layer formed on the PE-TEOS layer 330a react with oxygen contained in an etch gas and become either $RuO_3$ or $RuO_4$.

Figure 2:
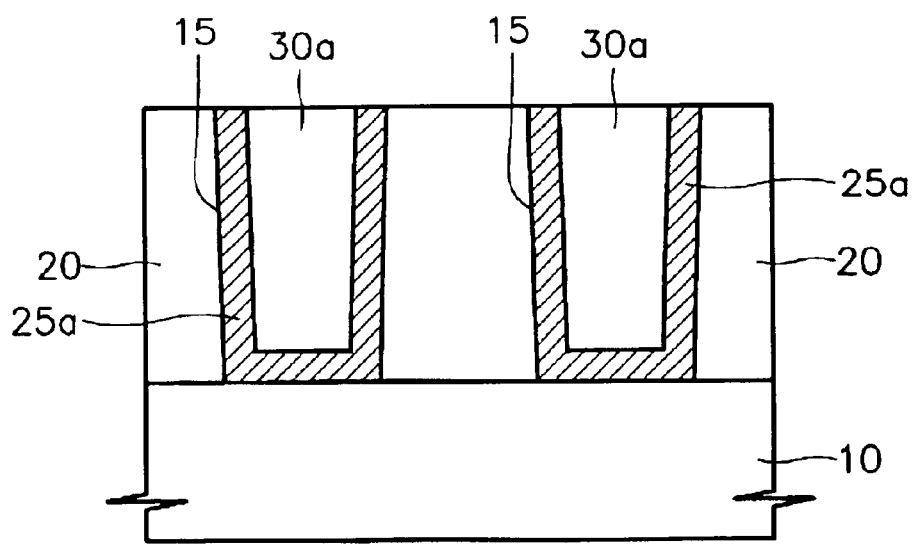
Figure 3:
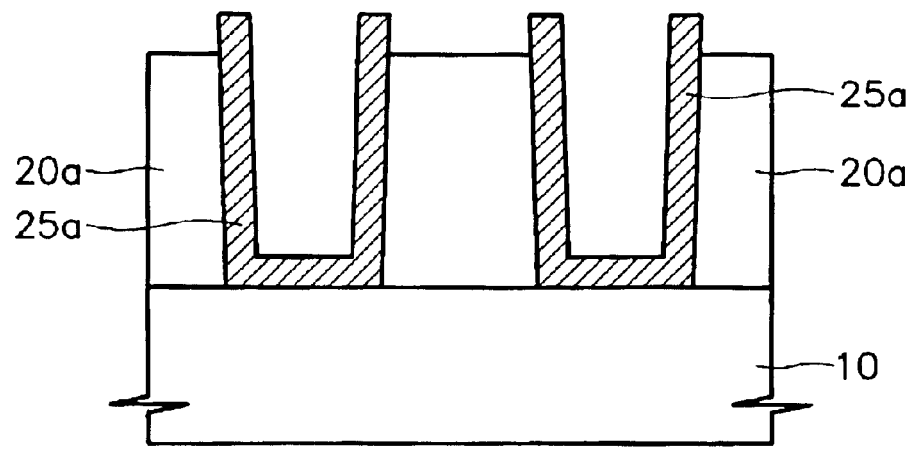
Figure 26:
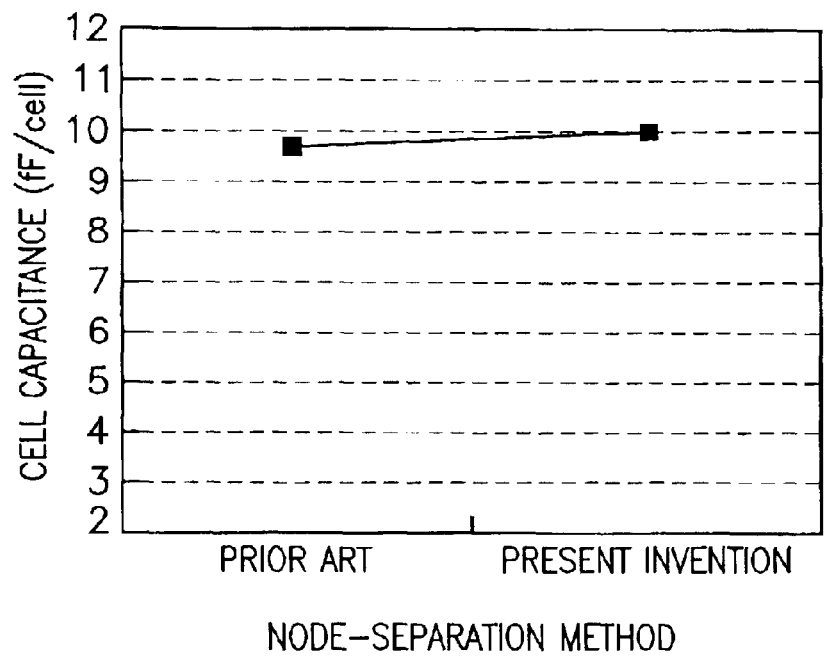
FIG. 26 is a graphical illustration showing cell capacitances measured with respect to a capacitor fabricated according to the present invention and a capacitor fabricated according to the prior art.
Figure 27:
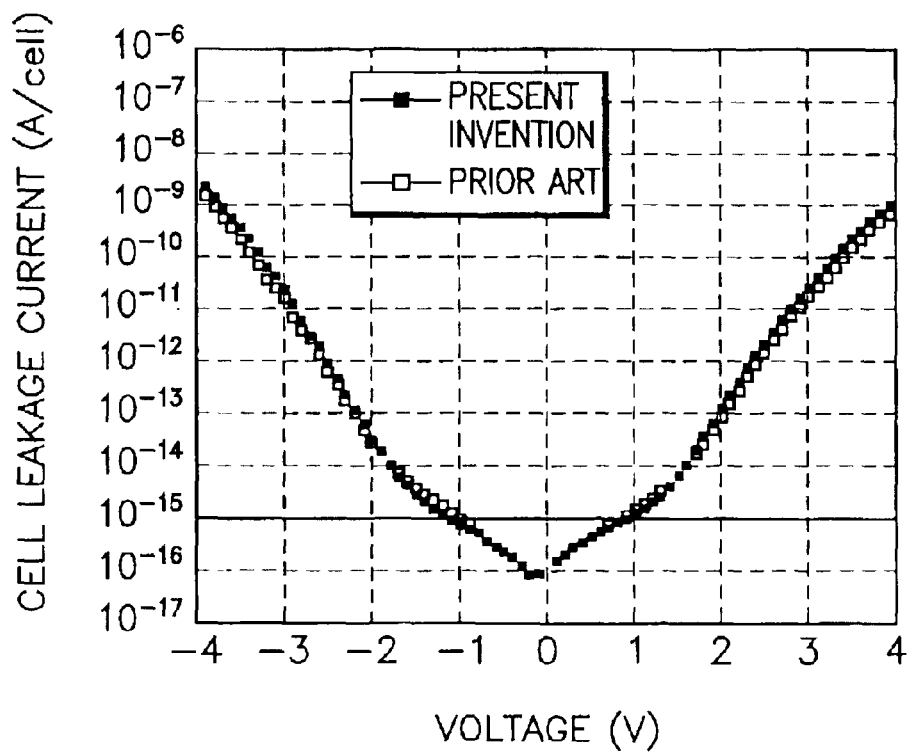
FIG. 27 is a graphical illustration showing cell leakage current measured with respect to a capacitor fabricated according to the present invention and a capacitor fabricated according to the prior art.

FIGS. 26 and 27 are graphical illustrations showing electrical characteristics measured after a $Ta_2O_5$ dielectric layer and a Ru upper electrode are formed on the Ru lower electrode shown in FIG. 23 to fabricate a capacitor, i.e., a $Ru/Ta_2O_5/Ru$ capacitor. Etch by-products deposited on the lower electrode were not removed. Electrical characteristics measured with respect to the $Ru/Ta_2O_5/Ru$ capacitor fabricated using a node-separation method described with reference to FIGS. 1–3 were shown.

FIG. 26 is a graphical illustration showing cell capacitances measured with respect to a capacitor fabricated according to the present invention and a capacitor fabricated according to the prior art. As shown in FIGS. 26 and 27, virtually the same electrical characteristics were obtained. Thus, it was confirmed that etch by-products deposited on the lower electrode did not affect the electrical characteristics of the capacitors. Accordingly, it was determined that the etch by-products might not have to be removed. Also, since the etch by-products are generally an oxide as in the results shown in FIG. 25, the etch by-products can be easily removed by subsequent thermal treatment in a reducing gas or vacuum atmosphere as described above with respect to the third embodiment of the present invention.

From the above-described experimental results, it was observed that a step of forming/removing an additional layer such as a capping layer can be omitted and a capacitor having stable electrical characteristics can be formed by a simpler process than that described in the prior art. It was also observed that by omitting the step of adding/removing an additional layer, only portions of the conductive layer outside the holes, i.e., on the upper surfaces of the insulating layer pattern, are removed by etch-back. Thus, production cost is lowered. Moreover, the fabrication process is simplified by omitting the capping step of the prior art. Additionally, leakage current can be prevented from being deteriorated due to the lack of protrusion of edges of the lower electrodes above the insulating layer, unlike the prior art, which often has the protrusion of the edges of the lower electrodes above the insulating layer after the capping layer is removed after node separation.

According to exemplary embodiments of the present invention, problems of existing prior art node-separation are solved in fabricating a MIM capacitor that is applicable to actual devices.

Although the invention has been described with reference to preferable embodiments, it will be apparent to one of ordinary skill in the art that modifications of the described embodiments may be made without departing from the spirit and scope of the invention.

What is claimed is:

1. A method of fabricating a capacitor of a semiconductor device, the method comprising:

depositing an insulating layer on a semiconductor substrate, the insulating layer having a substantially uniform composition;

etching regions of an insulating layer to form an insulating layer pattern having an upper surface and a plurality of holes having inner walls on a semiconductor substrate, the plurality of holes extending through the insulating layer and exposing an upper surface of contact plugs to produce an intermediate structure;

forming a conductive layer tbr capacitor lower electrodes on the entire surface of the intermediate structure to a thickness which does not completely fill the holes, the conductive layer being formed directly on the upper surface of the insulating layer;

forming capacitor lower electrodes separated from each other by etching back portions of the conductive layer on upper surfaces of the insulating layer pattern using a plasma, the plasma including at least one gas capable of selectively chemically etching portions of the conductive layer from the upper surface of the insulating layer pattern and wherein distribution of the plasma is controlled so that only portions of the conductive layer on the upper surfaces of the insulating layer pattern are removed, wherein bias is applied to the semiconductor substrate to cause etch by-products occurring during the etch-back to be deposited on portions of the conductive layer on the inner walls of the holes and thereby protect the portions of the conductive layer on the inner walls of the holes from being etched-back; and sequentially forming a dielectric layer and an upper electrode on the lower electrodes.

2. The method of claim 1, wherein the power of the bias is from 10 to 100W.

3. The method of claim 1, further comprising:

removing the etch by-products deposited on said portions of the conductive layer on the inner walls of the holes afkr the lower electrodes are formed.

4. The method of claim 3, wherein the etch by-products are removed by thermal treatment in a reducing gas atmosphere.

5. The method of claim 4, wherein said reducing gas is selected from the group consisting of argon, nitrogen, hydrogen and a combination thereof.

6. The method of claim 4, wherein the reducing gas atmosphere contains plasma.

7. The method of claim 3, wherein the etch by-products are removed by thermal treatment in a vacuum atmosphere.

8. The method of claim 7, wherein the temperature of the thermal treatment is 350° C. or more.

9. The method of claim 4, wherein the temperature of the thermal treatment is 350° C. or more.

10. The method of claim 1, wherein the pressure of the plasma is from 10 to 100 mTorr.

11. The method of claim 1, wherein the conductive layer is formed of Ru and the plasma contains oxygen.

12. The method of claim 1, wherein the conductive layer is formed of a member selected from the group consisting of a noble metal, an oxide of a noble metal, a conductive oxide and a combination thereof.

13. The method of claim 12, wherein the noble metal is selected from the group consisting of Ru, Pt and Ir.

14. The method of claim 12, wherein the conductive oxide is selected from the group consisting of$(La, Sr)CoO_3$, $BaSrRuO_3$ and $SrRuO_3$.

15. The method of claim 12, wherein the conductive layer is formed by a member selected from the group consisting of chemical vapor deposition, atomic layer deposition, a combination of physical vapor deposition and chemical vapor deposition and a combination of physical vapor deposition and atomic layer deposition.

16. The method of claim 1, further comprising:
removing the insulating layer patterns after the lower electrodes are formed.

17. The method of claim 1, wherein the dielectric layer is formed of one selected from the group consisting of $Ta_2O_5$, $Al_2O_3$, TaON, $(BaSr)TiO_3(BST)$, $SrTiO_3$, $BaTiO_3$, $(Pb,Zr)TiO_3(PZT)$, $(Pb, La, Zr)TiO_3(PLZT)$ and a combination thereof.

18. The method of claim 17, wherein the dielectric layer is formed by a member selected from the group consisting of chemical vapor deposition, atomic layer deposition, the combination of physical vapor deposition and chemical vapor deposition and the combination of physical vapor deposition and atomic layer deposition.

19. The method of claim 1, further comprising a step selected from the group consisting of ozone-treating the dielectric layer, plasma-treating the dielectric layer in a gas atmosphere including oxygen or nitrogen and thermal-treating the dielectric layer in a gas atmosphere including oxygen or nitrogen to improve electrical characteristics of the dielectric layer after said dielectric layer is formed.

20. The method of claim 19, wherein the temperature of the thermal treatment is from 500 to 800° C.

21. The method of claim 1, wherein the upper electrode is formed of a member selected from the group consisting of a noble metal, an oxide of a noble metal, a conductive oxide and a combination thereof.

22. The method of claim 21, wherein the noble metal is selected from the group consisting of Ru, Pt and Ir.

23. The method of claim 21, wherein the conductive oxide is selective from the group consisting of $(La, Sr)CoO_3$, $BaSrRuO_3$ and $SrRuO_3$.

24. The method of claim 21, wherein the upper electrode is formed by a member selected from the group consisting of chemical vapor deposition, atomic layer deposition, the combination of physical vapor deposition and chemical vapor deposition and the combination of physical vapor deposition and atomic layer deposition.

25. The method of claim 1, further comprising the step of thermal treating the upper electrode at a temperature of from 300–600° C. in a gas atmosphere including oxygen to improve electrical characteristics of the capacitor after the upper electrode is formed.

26. The method of claim 1, wherein the lower electrodes are formed using plasma including at least one of gas capable of selectively chemically etching portions of the conductive layer on the upper surface of the insulating layer patterns.

27. The method of claim 26, wherein the pressure of the plasma is from 10 to 100 mTorr.

28. The method of claim 26, wherein the conductive layer is formed of Ru and the plasma is oxygen.

29. The method of claim 26, wherein the distribution of the plasma is controlled so that only portions of the conductive layer on upper surfaces of the insulating layer patterns are removed.

30. The method of claim 1, wherein the conductive layer is formed of a member selected from the group consisting of a noble metal, an oxide of a noble metal, a conductive oxide and a combination thereof.

31. The method of claim 30, wherein the noble metal is selected from the group consisting of Ru, Pt and Ir.

32. The method of claim 30, wherein the conductive oxide is selected from the group consisting of $(La, Sr)CoO_3$, $BaSrRuO_3$ and $SrRuO_3$.

33. The method of claim 30, wherein the conductive layer is formed by a member selected from the group consisting of chemical vapor deposition, atomic layer deposition, the combination of physical vapor deposition and chemical vapor deposition and the combination of physical vapor deposition and atomic layer deposition.

34. The method of claim 1, further comprising the step of removing the insulating layer patterns after the lower electrodes are formed.

35. The method of claim 1, wherein the dielectric layer is formed of a member selected from the group consisting of $Ta_2O_5$, $Al_2O_3$, TaON, $(Ba, Sr)TiO_3(BST)$, $SrTiO_3$, $BaTiO_3$, $(Pb, Zr)TiO_3(PZT)$, $(Pb, La, Zr)TiO_3(PLZT)$ and a combination thereof.

36. The method of claim 35, wherein the dielectric layer is formed by a member selected from the group consisting of chemical vapor deposition, atomic layer deposition, the combination of physical vapor deposition and chemical vapor deposition and the combination of physical vapor deposition and atomic layer deposition.

37. The method of claim 1, further comprising a step selected from the group consisting of ozone-treating the dielectric layer, plasma-treating the dielectric layer in a gas atmosphere including oxygen or nitrogen and thermal-treating the dielectric layer in a gas atmosphere including oxygen or nitrogen to improve electrical characteristics of the dielectric layer after the dielectric layer is formed.

38. The method of claim 37, wherein the temperature of the thermal treatment is from 500–800° C.

39. The method of claim 1, wherein the upper electrode is formed of a member selected from the group consisting of a noble metal, an oxide of a noble metal, a conductive oxide and a combination thereof.

40. The method of claim 39, wherein the noble metal is selected from the group consisting of Ru, Pt and Jr.

41. The method of claim 39, wherein the conductive oxide is selected from the group consisting of $(La, Sr)CoO_3$, $BaSrRuO_3$ and $SrRuO_3$.

42. The method of claim 39, wherein the upper electrode is formed by a member selected from the group consisting of chemical vapor deposition, atomic layer deposition, the combination of physical vapor deposition and chemical vapor deposition and the combination of physical vapor deposition and atomic layer deposition.

43. The method of claim 1, further comprising thermal treating the upper electrode at a temperature of from 300 to 600° C. in a gas atmosphere including oxygen to improve electrical characteristics of the capacitor after the upper electrode is formed.

* * * * *